(12) United States Patent
Ryan

(10) Patent No.: US 12,113,012 B2
(45) Date of Patent: Oct. 8, 2024

(54) DEVICE, METHOD AND SYSTEM TO PREVENT PATTERN COLLAPSE IN A SEMICONDUCTOR STRUCTURE

(71) Applicant: Intel Corporation, Santa Clara, CA (US)

(72) Inventor: Errol Todd Ryan, Albuquerque, NM (US)

(73) Assignee: Intel Corporation, Santa Clara, CA (US)

( * ) Notice: Subject to any disclaimer, the term of this patent is extended or adjusted under 35 U.S.C. 154(b) by 763 days.

(21) Appl. No.: 17/110,007

(22) Filed: Dec. 2, 2020

(65) Prior Publication Data

US 2022/0173031 A1  Jun. 2, 2022

(51) Int. Cl.
*H01L 23/522* (2006.01)
*G11C 5/06* (2006.01)
(Continued)

(52) U.S. Cl.
CPC ............ *H01L 23/5226* (2013.01); *G11C 5/06* (2013.01); *H01L 21/4853* (2013.01);
(Continued)

(58) Field of Classification Search
CPC .............. H01L 23/5226; H01L 21/4853; H01L 21/486; H01L 21/76802; H01L 21/76841; H01L 21/76877; H01L 24/14; G11C 5/06; H10B 41/27; H10B 43/27; H10B 63/84; H10B 69/00; H10B 41/20; H10B 43/20; H10B 63/30; H10N 70/063; H10N 70/20; H10N 70/231; H10N 70/801; H10N 70/826

See application file for complete search history.

(56) References Cited

U.S. PATENT DOCUMENTS

2011/0095258 A1   4/2011  Xu et al.
2016/0343718 A1  11/2016  Lu et al.
(Continued)

OTHER PUBLICATIONS

EPO; Extended European Search Report issued in EP Patent Application No. 21197106.4, dated Mar. 14, 2022; 8 pages.
(Continued)

*Primary Examiner* — Karen Kusumakar
(74) *Attorney, Agent, or Firm* — Alliance IP, LLC

(57) ABSTRACT

A semiconductor fabrication method, a semiconductor device and a semiconductor module. The method comprises: providing a stack on a substrate, the stack including a plurality of device layers comprising electrically conductive layers; patterning the stack using an etch to form trenches extending therethrough and pillars between the trenches; providing a carbon-containing liner on sidewalls of the trenches; wet cleaning and drying the stack after providing the carbon-containing liner; filling spaces between the pillars with one or more materials; and electrically coupling contact lines to the electrically conductive layers to form the semiconductor device. The carbon-containing liner may include a carbon-doped liner, such as a carbon-doped oxide liner provided by way of atomic layer deposition of an oxide at temperatures between about 100 degrees Celsius to about 300 degree Celsius using carbon as a precursor.

18 Claims, 9 Drawing Sheets

(51) Int. Cl.
    *H01L 21/48*      (2006.01)
    *H01L 21/768*     (2006.01)
    *H01L 23/00*      (2006.01)
    *H10B 41/27*      (2023.01)
    *H10B 43/27*      (2023.01)

(52) U.S. Cl.
    CPC ...... *H01L 21/486* (2013.01); *H01L 21/76802* (2013.01); *H01L 21/76841* (2013.01); *H01L 21/76877* (2013.01); *H01L 24/14* (2013.01); *H10B 41/27* (2023.02); *H10B 43/27* (2023.02)

(56) References Cited

U.S. PATENT DOCUMENTS

| | | | |
|---|---|---|---|
| 2018/0366323 A1 | 12/2018 | Huang et al. | |
| 2019/0267232 A1* | 8/2019 | Andreas | H01L 21/02057 |
| 2022/0108947 A1* | 4/2022 | Luo | H01L 23/5226 |

OTHER PUBLICATIONS

Baklanov, M.R., et al.; "Impact of VUV photons on SiO2 and organosilicate low-k dielectrics: General behavior, practical applications, and atomic models;" Applied Physics Reviews Rev. 6; https://doi.org/10.1063/1.5054304; published online Feb. 1, 2019; 64 pages.

Liu, Xiao Hu; "Impact of pattern collapse on future micro/nano fabrication," 2017 IEEE International Interconnect Technology Conference (IITC), Hsinchu, 2017, pp. 1-3, doi: 10.1109/IITC-AMC.2017.7968953.

* cited by examiner

DEVICE, METHOD AND SYSTEM TO PREVENT PATTERN COLLAPSE IN A SEMICONDUCTOR STRUCTURE

FIELD

The present disclosure relates in general to the field of semiconductor fabrication, and more specifically, to semiconductor fabrication including the provision of high aspect ratio features in a semiconductor structure by way of an etch procedure followed by wet cleaning and drying.

BACKGROUND

A storage device may include non-volatile memory, such as multi-stack 3D memory cells or arrays. The memory cells typically include high aspect ratio cell structures made by way of performing successive etches to form successively deeper trenches into a layered structure, and using a wet cleaning procedure followed by drying after at least one of the etches.

In particular, current integration schemes for the fabrication of 3D memory structures rely on the provision of a nitride liner and an oxide etch protection liner provided using atomic layer deposition (ALD) on top of the nitride liner after a first etch of the various layers of the 3D memory structure. A first etch may first etch through a first subset of the layers of the 3D memory structure to form a first trench, and the nitride liner and etch protection liner may be deposited onto that first trench. The nitride liner and oxide etch protection liner are provided to protect one or more underlying layers within the various layers of the 3D memory structure during a second etch of the various layers. The nitride layer may be provided using chemical vapor deposition (CVD) or atomic layer deposition (ALD), and the oxide may be provided using ALD. For example, a second etch may subsequently etch through a second subset of the layers of the 3D memory structure to form a second trench longer than the first trench. Another nitride liner and another oxide etch protection liner using ALD are then provided to protect any sensitive layers during a last etch through a remaining subset of the layers of the 3D memory structure to form a third trench longer than the second trench.

The ALD oxide layer provided during the successive etches is typically hydrophilic, leading to a high surface tension during the second etch and last etch wet clean drying processes, which tends to drive line wiggling and/or pattern collapse of high aspect ratio pillars. Thus, in some previous approaches, capillary forces in the trenches, resulting from drying the pillars after wet cleaning, can cause the pillars to topple (e.g., collapse) into each other.

Pattern collapse during the wet clean drying process is a challenge for high aspect ratio cell structures, and is expected to be aggravated by virtue of cell scaling. Pattern collapse can result from the capillary forces exerted on trench sidewalls during the wet cleaning and drying process. The capillary forces can work to topple high aspect ratio features defining the trenches toward one another, and can lead to reliability issues with respect to memory devices formed therefrom.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
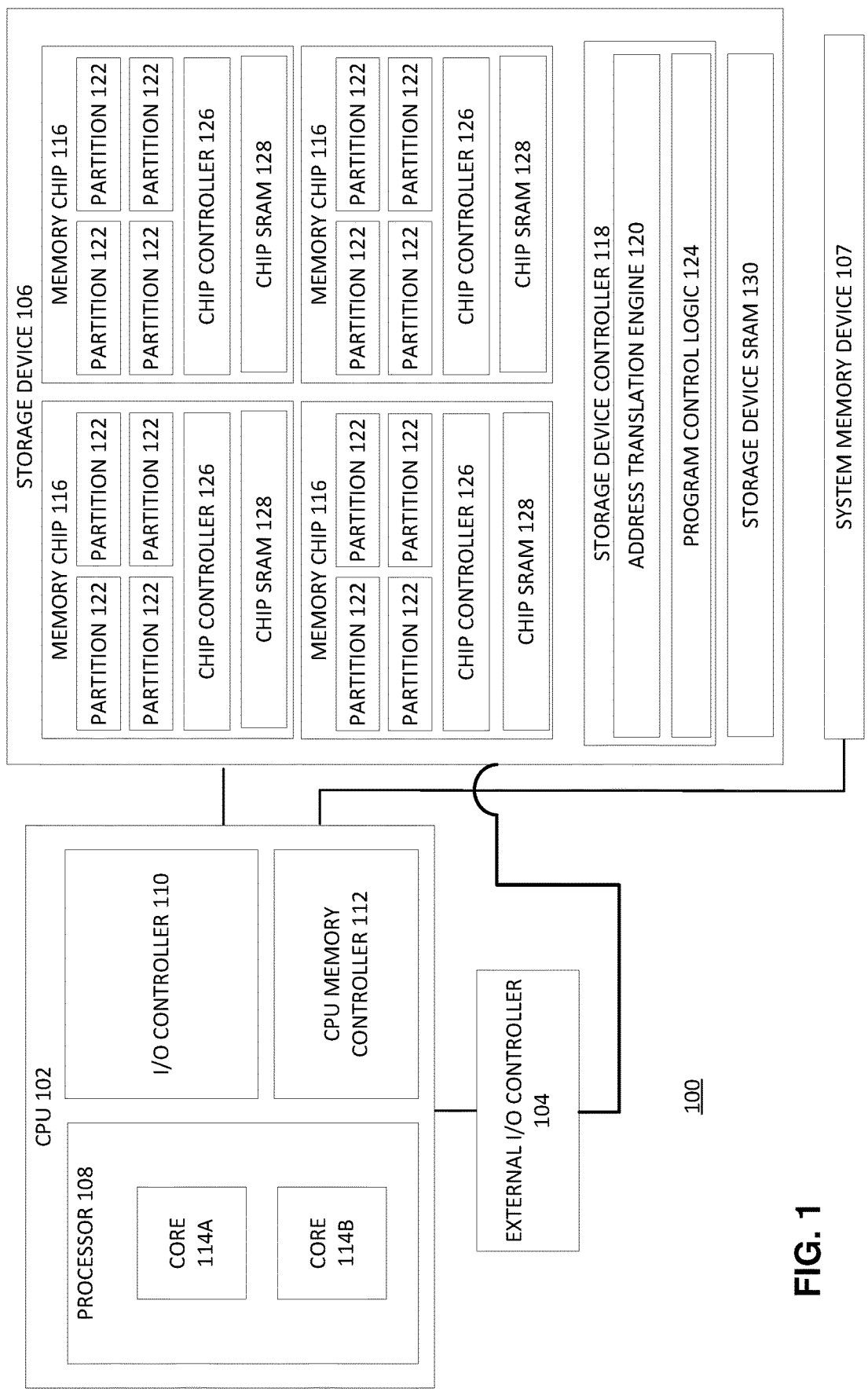
FIG. 1 is a schematic illustration of a block diagram of components of a computer system according to some embodiments.

FIG. 1 illustrates a block diagram of components of a computer system 100 in accordance with some embodiments. System 100 includes a central processing unit (CPU) 102 coupled to an external input/output (I/O) controller 104, a storage device 106 such as a solid state drive (SSD), and system memory device 107. During operation, data may be transferred between a storage device 106 and/or system memory device 107 and the CPU 102. In various embodiments, particular memory access operations (e.g., read and write operations) involving a storage device 106 or system memory device 107 may be issued by an operating system and/or other software applications executed by processor 108. In various embodiments, a storage device 106 may include a storage device controller 118 and one or more memory chips 116 that each comprise any suitable number of memory partitions 122.

In various embodiments, a memory partition 122 may include a 3D crosspoint memory array. In some embodiments, a 3D crosspoint memory array may comprise a transistor-less (e.g., at least with respect to the data storage elements of the memory) stackable crosspoint architecture in which memory cells sit at the intersection of row address lines and column address lines arranged in a grid.

During a read operation, a differential bias sometimes referred to as a demarcation voltage (VDM) may be applied across the terminals of the memory cell and the state of the memory cell may be sensed based on the reaction of the memory cell to the applied bias. For example, the memory cell may either go into a conductive ON state (logic one) or remain in a weakly conductive OFF state (logic zero). The applied voltage at which a memory cell transitions from being sensed as a logic one to being sensed as a logic zero may be termed a threshold voltage of the memory cell. Thus, as an example, when the VDM is higher than the threshold voltage of the memory cell, the memory cell may be sensed as storing a logic one and when the VDM is lower than the threshold voltage of the memory cell, the memory cell may be sensed as storing a logic zero.

CPU 102 comprises a processor 108, such as a microprocessor, an embedded processor, a digital signal processor (DSP), a network processor, a handheld processor, an application processor, a co-processor, an SOC, or other device to execute code (e.g., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric. CPU 102 may be referred to herein as a host computing device (though a host computing device may be any suitable computing device operable to issue memory access commands to a storage device 106).

A processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., 114A or 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

The processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable logic capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise storage device controller 118 of storage device 106 coupled to the CPU 102 through I/O controller 110. I/O circuitry (not shown) of the storage device controller 118 may be used for communication of data and signals between the CPU and the storage device controller 118 of storage device 106.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and an associated I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller 110 may be located off-chip (e.g., not on the same chip as CPU 102) or may be integrated on the same chip as the CPU 102.

CPU memory controller 112 is an integrated memory controller that controls the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces. According to an alternative embodiment, the external I/O controller 104 may be used to couple of the CPU 102 to I/O devices other than the storage device 106, and the storage device 106 may be directly coupled to the CPU 102.

In the instant disclosure, I/O controller 110, CPU memory controller 112, external I/O controller 104 may each be referred to, from the standpoint of the storage device 106, as an "external controller."

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store temporary data, persistent data (e.g., a user's files or instruction sequences) that maintains its state even after power to the system memory device 107 is removed, or a combination thereof. A system memory device 107 may be dedicated to a particular CPU 102 or shared with other devices (e.g., one or more other processors or other devices) of computer system 100.

In various embodiments, a system memory device 107 may include a memory comprising any number of memory partitions, a memory device controller, and other supporting logic (not shown). A memory partition may include nonvolatile memory and/or volatile memory.

Non-volatile memory is a storage medium that does not require power to maintain the state of data stored by the medium, thus non-volatile memory may have a determinate state even if power is interrupted to the device housing the memory. In various embodiments, non-volatile memory may be byte or block addressable. Nonlimiting examples of nonvolatile memory may include any or a combination of: solid state memory (such as planar or 3-dimensional (3D) NAND flash memory or NOR flash memory), 3D crosspoint memory, phase change memory or SXP memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium (thus volatile memory is memory whose state (and therefore the data stored on it) is indeterminate if power is interrupted to the device housing the memory). Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications.

A storage device 106 may store any suitable data, such as data used by processor 108 to provide functionality of computer system 100. For example, data associated with programs that are executed or files accessed by cores 114A and 114B may be stored in storage device 106. A storage device 106 may store data and/or sequences of instructions that are executed or otherwise used by the cores 114A and 114B. In various embodiments, a storage device 106 may store persistent data (e.g., a user's files or software application code) that maintains its state even after power to the storage device 106 is removed. A storage device 106 may be dedicated to CPU 102 or shared with other devices (e.g., another CPU or other device) of computer system 100.

In the embodiment depicted, storage device 106 includes a storage device controller 118 and four memory chips 116 each comprising four memory partitions 122 operable to store data, however, a storage device may include any suitable number of memory chips each having any suitable number of memory partitions. A memory partition 122 includes a plurality of memory cells operable to store data. The cells of a memory partition 122 may be arranged in any suitable fashion, such as in rows (e.g., wordlines) and columns (e.g., bitlines), three-dimensional structures, sectors, or in other ways. In various embodiments, the cells may be logically grouped into banks, blocks, subblocks, wordlines, pages, frames, bytes, slices, or other suitable groups. In various embodiments, a memory partition 122 may include any of the volatile or non-volatile memories listed above or other suitable memory. In a particular embodiment, each memory partition 122 comprises one or more 3D crosspoint memory arrays. 3D crosspoint arrays are described in more detail in connection with the following figures.

In various embodiments, storage device 106 may comprise a solid state drive; a memory card; a Universal Serial Bus (USB) drive; a Non-Volatile Dual In-line Memory Module (NVDIMM); storage integrated within a device such as a smartphone, camera, or media player; or other suitable mass storage device.

In a particular embodiment, one or more memory chips 116 are embodied in a semiconductor package. In various embodiments, a semiconductor package may comprise a casing comprising one or more semiconductor chips (also referred to as dies). A package may also comprise contact pins or leads used to connect to external circuits. In various embodiments, a memory chip may include one or more memory partitions 122.

Accordingly, in some embodiments, storage device 106 may comprise a package that includes a plurality of chips that each include one or more memory partitions 122. However, a storage device 106 may include any suitable arrangement of one or more memory partitions and associated logic in any suitable physical arrangement. For example, memory partitions 122 may be embodied in one or more different physical mediums, such as a circuit board, semiconductor package, semiconductor chip, disk drive, other medium, or any combination thereof.

System memory device 107 and storage device 106 may comprise any suitable types of memory and are not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Similarly, system memory 107 may have any suitable form factor. Moreover, computer system 100 may include multiple different types of storage devices.

System memory device 107 or storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. A system memory device 107 or storage device 106 may also include a communication interface to communicate with CPU memory controller 112 or I/O controller 110 in accordance with any suitable logical device interface specification such as NVMe, AHCI, or other suitable specification. In particular embodiments, system memory device 107 or storage device 106 may comprise multiple communication interfaces that each communicate using a separate protocol with CPU memory controller 112 and/or I/O controller 110.

Storage device controller 118 may include logic to receive requests from CPU 102 (e.g., via an interface that communicates with CPU memory controller 112 or I/O controller 110), cause the requests to be carried out with respect to the memory chips 116, and provide data associated with the requests to CPU 102 (e.g., via CPU memory controller 112 or I/O controller 110). Storage device controller 118 may also be operable to detect and/or correct errors encountered during memory operations via an error correction code (ECC engine). In an embodiment, controller 118 also tracks, e.g., via a wear leveling engine, the number of times particular cells (or logical groupings of cells) have been written to in order to perform wear leveling, detect when cells are nearing an estimated number of times they may be reliably written to, and/or adjust read operations based on the number of times cells have been written to. In performing wear leveling, the storage device controller 118 may evenly spread out write operations among the cells of memory chips 116 in an attempt to equalize the number of operations (e.g., write operations) performed by each cell. In various embodiments, controller 118 may also monitor various characteristics of the storage device 106 such as the temperature or voltage and report associated statistics to the CPU 102. Storage device controller 118 can be implemented on the same circuit board or device as the memory chips 116 or on a different circuit board or device. For example, in some environments, storage device controller 118 may be a centralized storage controller that manages memory operations for multiple different storage devices 106 of computer system 100.

In various embodiments, the storage device 106 also includes program control logic 124 which is operable to control the programming sequence performed when data is written to or read from a memory chip 116. In various embodiments, program control logic 124 may provide the various voltages (or information indicating which voltages should be provided) that are applied to memory cells during the programming and/or reading of data (or perform other operations associated with read or program operations), perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 described herein may be located on a memory chip 116. In various embodiments, reference herein to a "controller" may refer to any suitable control logic, such as storage device controller 118, chip controller 126, or a partition controller. In some embodiments, reference to a controller may contemplate logic distributed on multiple components, such as logic of a storage device controller 118, chip controller 126, and/or a partition controller.

In various embodiments, storage device controller 118 may receive a command from a host device (e.g., CPU 102), determine a target memory chip for the command, and communicate the command to a chip controller 126 of the target memory chip. In some embodiments, the storage device controller 118 may modify the command before sending the command to the chip controller 126.

In various embodiments, the storage device controller 118 may send commands to memory chips 116 to perform host-initiated read operations as well as device-initiated read operations. A host-initiated read operation may be performed in response to reception of a read command from a host coupled to the storage device 106, such as CPU 102. A device-initiated read operation may be a read operation that is performed in response to a device-initiated read command generated by the storage device 106 independent of receiving a read command from the host. In various embodiments, the storage device controller 118 may be the component that generates device-initiated read commands. The storage device 106 may initiate a device-initiated read command for any suitable reason. For example, upon power up of a storage device, the storage device 106 may initiate a plurality of read and write-back commands to re-initialize data of the storage device 106 (e.g., to account for any drift that has occurred while the storage device 106 or a portion thereof was powered off or has sat idle for a long period of time).

The chip controller 126 may receive a command from the storage device controller 118 and determine a target memory partition 122 for the command. The chip controller 126 may then send the command to a controller of the determined memory partition 122. In various embodiments, the chip controller 126 may modify the command before sending the command to the controller of the partition 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die (e.g., on-chip) or package or any of the elements of CPU 102 may be located off-chip or off-package. Similarly, the elements depicted in storage device 106 may be located on a single chip or on multiple chips. In various embodiments, a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Storage device SRAM/DRAM 130 and chip SRAM/DRAM 128 each are adapted to execute internal firmware or software of the storage device 106 and memory chip 116 respectively. For example, the logic to be implemented by program control logic 124, upon the issuance of a command, for example from the host or CPU 102 to execute the logic, may be moved from a memory storing the logic to SRAM/DRAM 130 such that the logic may be executed by the storage device controller 118 which will have access to the logic instructions by way of the associated SRAM/DRAM 128. Similarly, the logic to be implemented by the chip controller 126, upon the issuance of a command, for example from the host or CPU 102 to execute the logic, may be moved from a memory storage the logic to the associated SRAM/DRAM 128 (or another type of memory) such that the logic may be executed by the associated chip controller 126 which will have access to the logic instructions by way of the associated SRAM/DRAM 128.

Figure 2:
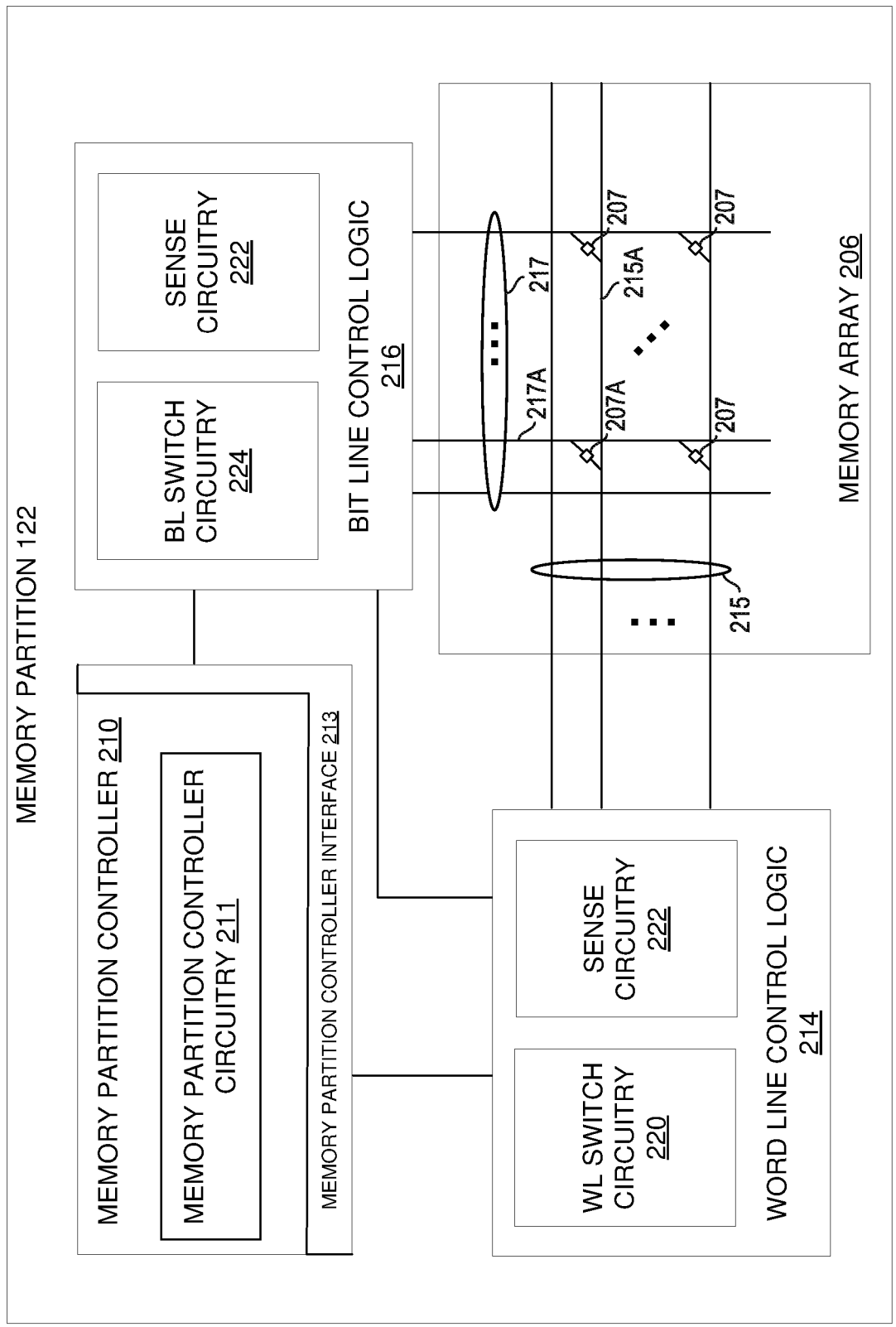
FIG. 2 is a schematic illustration of a memory partition in accordance with certain embodiments.

FIG. 2 illustrates a detailed exemplary view of the memory partition 122 of FIG. 1 in accordance with certain embodiments. In one embodiment, a memory partition 122 may include 3D crosspoint memory which may include phase change memory or other suitable memory types. In a particular embodiment, phase change memory may utilize a chalcogenide material for memory elements. A memory element is a unit of a memory cell that actually stores the information. In operation, phase change memory may store information on the memory element by changing the phase of the memory element between amorphous and crystalline phases. The material of a memory element (e.g., the chalcogenide material) may exhibit either a crystalline or an amorphous phase, exhibiting a low or high conductivity. Generally, the amorphous phase has a low conductivity (high impedance) and is associated with a reset state (logic zero) and the crystalline phase has a high conductivity (low impedance) and is associated with a set state (logic one). The memory element may be included in a memory cell 207 (e.g., a phase change memory cell) that also includes a selector, e.g., a select device coupled to the memory element. The select devices are configured to facilitate combining a plurality of memory elements into an array.

In some embodiments, a 3D crosspoint memory array 206 may comprise a transistor-less (e.g., at least with respect to the data storage elements of the memory) stackable crosspoint architecture in which memory cells 207 sit at the intersection of row address lines and column address lines arranged in a grid. The row address lines 215 and column address lines 217, called word lines (WLs) and bit lines (BLs), respectively, cross in the formation of the grid and each memory cell 207 is coupled between a WL and a BL where the WL and BL cross (e.g., at a crosspoint). At the point of a crossing, the WL and BL may be located at different vertical planes such that the WL crosses over the BL but does not physically touch the BL. As described above, the architecture may be stackable, such that a word line may cross over a bit line located beneath the word line and another bit line for another memory cell located above the word line. It should be noted that row and column are terms of convenience used to provide a qualitative description of the arrangement of WLs and BLs in crosspoint memory. In various embodiments, the cells of the 3D crosspoint memory array may be individually addressable. In some embodiments, bit storage may be based on a change in bulk resistance of a 3D crosspoint memory cell. In various embodiments, 3D crosspoint memory may include any of the characteristics of 3D XPoint memory manufactured by INTEL CORPORATION (Optane™ is the Intel Trademark for Intel's 3D crosspoint (3D Xpoint™) technology).

During a programming operation (e.g., a write operation), the phase of the memory element may be changed by the application of a first bias voltage to the WL and a second bias voltage to the BL resulting in a differential bias voltage across the memory cell that may cause a current to flow in the memory element. The differential bias voltage may be maintained across the memory cell for a time period sufficient to cause the memory element to "snap back" and to transition the memory element from the amorphous state to the crystalline state or from the crystalline state to the amorphous state (e.g., via the application of heat produced by an electric current). Snap back is a property of the composite memory element that results in an abrupt change in conductivity and an associated abrupt change in the voltage across the memory element.

In a read operation, a target memory cell is selected via the application of a first bias voltage to the selected WL and a second bias voltage to the selected BL that cross at the target memory cell for a time interval. A resulting differential bias voltage (a demarcation read voltage (VDM)) across the memory element is configured to be greater than a maximum set voltage and less than a minimum reset voltage for the memory element. Selection of the selected WL and selected BL and application of the first bias and second bias voltage may be implemented by a decoder in a switch circuitry, such as WL switch circuitry 220 and BL switch circuitry 240. In response to application of the VDM, the target memory element may or may not snap back, depending on whether the memory element is in the crystalline state (set) or the amorphous state (reset). Sense circuitry, coupled to the memory element, is configured to detect the presence or absence of snap back in a sensing time interval. The presence of snap back may then be interpreted as a logic one and the absence of snap back as a logic zero.

The differential bias at which a memory cell transitions from being sensed as a logic one (e.g., due to the memory cell snapping back) to being sensed as a logic zero (e.g., due to the memory cell not snapping back), may be termed a threshold voltage (sometimes referred to as a snap back voltage). Thus, when the VDM is higher than the threshold voltage of the memory cell, the memory cell may be sensed as storing a logic one and when the VDM is lower than the threshold voltage of the memory cell, the memory cell may be sensed as storing a logic zero.

In some embodiments, an applied bias such as the VDM of a read pulse may be high enough to only turn on 3D crosspoint cells in the crystalline state, which may have a lower threshold voltage than 3D crosspoint cells in the amorphous state. In some embodiments, the VDM may be supplied through negative and/or positive regulated nodes. For example, the bitline electrode of the 3D crosspoint cell may be a positive regulated node and the wordline electrode coupled to the cell may supply the bias for VDM.

For a write operation or a read operation, one memory cell 207A out of many cells, such as thousands of cells, may be selected as the target cell for the read or write operation, the cell being at the cross section of a BL 217A and a WL 215A. All cells coupled to BL 217A and all cells coupled to WL 215A other than cell 207A may still receive a portion of VDM (e.g., approximately ½ of VDM), with only cell 207A receiving the full VDM.

In the embodiment of FIG. 2, a memory partition 122 includes memory partition controller 210, word line control logic 214, bit line control logic 216, and memory array 206. A host device (e.g., CPU 102) may provide read and/or write commands including memory address(es) and/or associated data to memory partition 122 (e.g., via storage device controller 118 and chip controller 126) and may receive read data from memory partition 122 (e.g., via the chip controller 126 and storage device controller 118). Similarly, storage device controller 118 may provide host-initiated read and write commands or device-initiated read and write commands including memory addresses to memory partition 122 (e.g., via chip controller 126). Memory partition controller 210 (in conjunction with word line control logic 214 and bit line control logic 216) is configured to perform memory access operations, e.g., reading one or more target memory cells and/or writing to one or more target memory cells.

Memory array 206 corresponds to at least a portion of a 3D crosspoint memory (e.g., that may include phase change memory cells or other suitable memory cells) and includes a plurality of word lines 215, a plurality of bit lines 217 and a plurality of memory cells, e.g., memory cells 207. Each memory cell is coupled between a word line ("WL") and a bit line ("BL") at a crosspoint of the WL and the BL. Each memory cell includes a memory element configured to store information and may include a memory cell select device (e.g., selector) coupled to the memory element. Select devices may include ovonic threshold switches, diodes, bipolar junction transistors, field-effect transistors, etc. Memory array 206 may be configured to store binary data and may be written to (e.g., programmed) or read from.

Memory partition controller 210 may manage communications with chip controller 126 and/or storage device controller 118. In a particular embodiment, memory partition controller 210 may analyze one or more signals received from another controller to determine whether a command sent via a bus is to be consumed by the memory partition 122. For example, controller 210 may analyze an address of the command and/or a value on an enable signal line to determine whether the command applies to the memory partition 122. Controller 210 may be configured to identify one or more target WLs and/or BLs associated with a received memory address (this memory address may be a separate address from the memory partition address that identifies the memory partition 122, although in some embodiments a portion of an address field of a command may identify the memory partition while another portion of the address field may identify one or more WLs and/or BLs). Memory partition controller 210 may be configured to manage operations of WL control logic 214 and BL control logic 216 based, at least in part, on WL and/or BL identifiers included in a received command. Memory partition controller 210 may include memory partition controller circuitry 211, and a memory controller interface 213. Memory controller interface 213, although shown as a single block in FIG. 2, may include a plurality of interfaces, for example a separate interface for each of the WL control logic 214 and the BL control logic 216.

WL control logic 214 includes WL switch circuitry 220 and sense circuitry 222. WL control logic 214 is configured to receive target WL address(es) from memory partition controller 210 and to select one or more WLs for reading and/or writing operations. For example, WL control logic 214 may be configured to select a target WL by coupling a WL select bias voltage to the target WL. WL control logic 214 may be configured to deselect a WL by decoupling the target WL from the WL select bias voltage and/or by coupling a WL deselect bias voltage to the WL. WL control logic 214 may be coupled to a plurality of WLs 215 included in memory array 206. Each WL may be coupled to a number of memory cells corresponding to a number of BLs 217. WL switch circuitry 220 may include a plurality of switches, each switch configured to couple (or decouple) a respective WL, e.g., WL 215A, to a WL select bias voltage to select the respective WL 215A. For example, WL switch circuitry 220 may include a plurality of switches that each correspond to a particular WL. In one embodiment, each switch includes a pair of metal oxide semiconductor field effect transistors (MOSFETs) comprising a positive-type (p-type) metal oxide semiconductor transistor (PMOS) and a negative-type (n-type) MOS transistor (NMOS). The pair may form a complementary MOS circuit (CMOS).

BL control logic 216 includes BL switch circuitry 224. In some embodiments, BL control logic 216 may also include sense circuitry, e.g., sense circuitry 222. BL control logic 216 is configured to select one or more BLs for reading and/or writing operations. BL control logic 216 may be configured to select a target BL by coupling a BL select bias voltage to the target BL. BL control logic 216 may be configured to deselect a BL by decoupling the target BL from the BL select bias voltage and/or by coupling a BL deselect bias voltage to the BL. BL switch circuitry 224 is similar to WL switch circuitry 220 except BL switch circuitry 224 is configured to couple the BL select bias voltage to a target BL.

Sense circuitry 222 is configured to detect the state of one or more sensed memory cells 207 (e.g., via the presence or absence of a snap back event during a sense interval), e.g., during a read operation. Sense circuitry 222 is configured to provide a logic level output related to the result of the read operation to, e.g., memory partition controller 210. For example, a logic level corresponding to a logic one may be output if the applied VDM is higher than the memory cell's threshold voltage or a logic zero if the applied VDM is lower than the memory cell's threshold voltage. In a particular embodiment, a logic one may be output if a snap back is detected and a logic zero may be output if a snap back is not detected.

As an example, in response to a signal from memory partition controller 210, WL control logic 214 and BL control logic 216 may be configured to select a target memory cell, e.g., memory cell 207A, for a read operation by coupling WL 215A to WL select bias voltage and BL 217A to BL select bias voltage as well as coupling the other WLs and BLs to respective deselect bias voltages. One or both of sense circuitries 222 may then be configured to monitor WL 215A and/or BL 217A for a sensing interval in order to determine the state of the memory cell 207A (e.g., to determine whether or not a snap back event occurs). For example, if a sense circuitry 222 detects a snap back event, then memory cell 207A may be in the set state, but if a sense circuitry 222 does not detect a snap back event in the sensing interval, then memory cell 207A may be in the reset state.

Thus, WL control logic 214 and/or BL control logic 216 may be configured to select a target memory cell for a read operation, initiate the read operation, sense the selected memory cell (e.g., for a snap back event) in a sensing interval, and provide the result of the sensing to, e.g., memory partition controller 210.

In a particular embodiment, the sense circuitry 222 may include a WL load connected to a WL electrode or gate, and a BL load connected to a BL electrode or gate. When a particular wordline and bitline are selected in the array, a difference between WL load or WL voltage and the BL voltage corresponds to a read VDM. VDM may induce a current (icell) in the memory cell 207A. A comparator such as a sense amplifier may compare icell with a reference current in order to read a logic state one or logic state zero depending on whether the memory cell is a set cell or a reset cell. The reference current may thus be selected such that the current of the target memory cell is lower than the reference current before snapback of the target memory cell and higher than the reference current after snapback of the target memory cell. In this manner, an output of the sense amplifier/comparator may be indicative of a state of the target memory cell. A latch may be coupled to the output of the comparator to store the output of the read operation.

For each matrix of arrays, there may be a number of sense amplifiers provided, with the sense circuitry 222 able to process up to a maximum number of sensed bits, such as 128 bits, from the sense amplifiers at one time. Hence, 128 memory cells may be sensed at one time by sense amplifiers of the sense circuitry 222.

Figure 3:
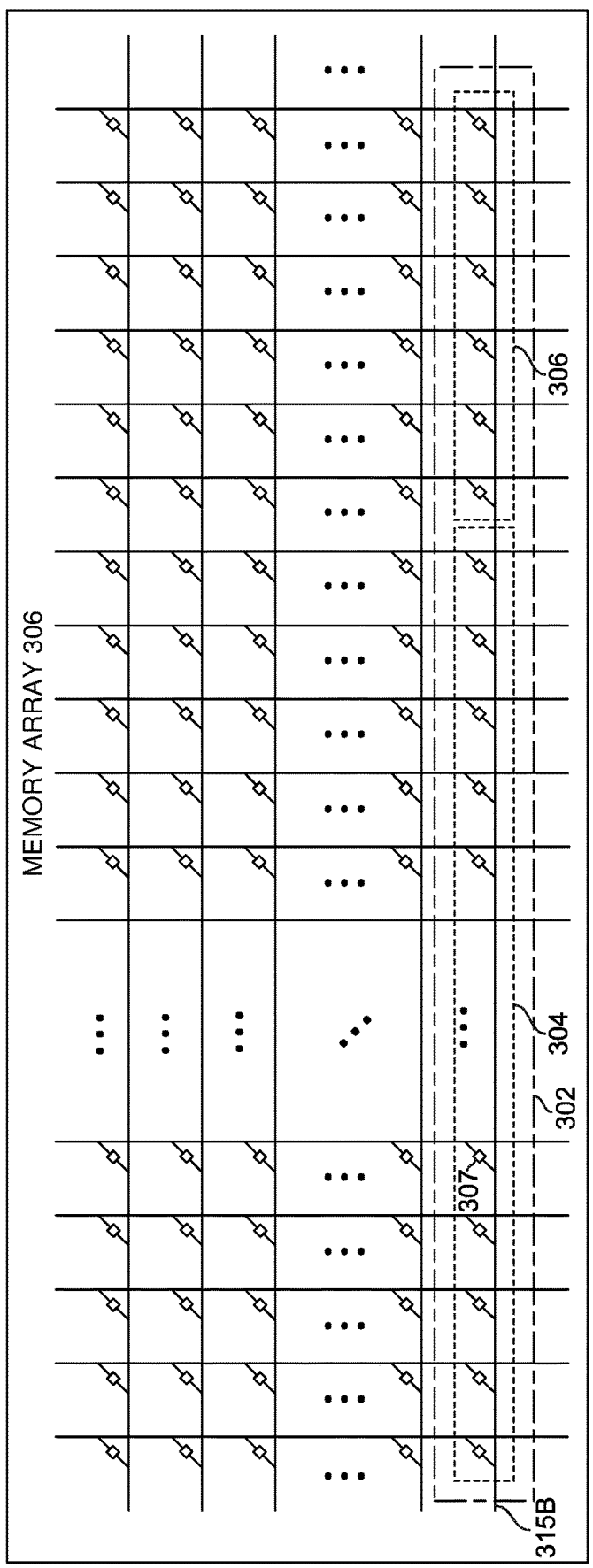
FIG. 3 is a schematic illustration of a memory array in accordance with certain embodiments.

FIG. 3 illustrates a detailed exemplary view of the memory array 206 of FIG. 2 in accordance with certain embodiments. In various embodiments, a plurality of memory cells 207 of memory array 206 may be divided into a logical group such as a slice 302 (and the memory array 206 may include a plurality of slices). In the embodiment depicted, slice 302 includes a plurality of memory cells 207 coupled to the same WL 215A, though a slice 302 may comprise any suitable arrangement of memory cells.

In a particular embodiment, a slice may include a payload portion 304 and a metadata portion 306. The memory cells of the payload portion 304 may store data written to the storage device 106 by a host (e.g., CPU 102/104). For example, the host may send a write command specifying payload data to be written to the storage device 106 at a particular logical address. The payload of the write command may be stored in a payload portion 304 of one or more slices 302 (in various embodiments, the payload portion 304 may be large enough to hold payload data from multiple write commands from the host). In various embodiments, the size of the payload portion of a slice may have any suitable size, such as 1 kibibyte (KiB), 2 KiB, 4 KiB, 8 KiB, or other suitable size.

The memory cells of the metadata portion 306 of a slice 302 may store metadata associated with the payload data stored in the payload portion 304 of the slice 302 or the slice itself. The metadata portion 306 may store any suitable metadata associated with the payload data or slice. For example, the metadata portion 306 may store parity bits and/or cyclic redundancy check (CRC) bits used during error detection and error correction, e.g., by the storage device controller 118. In alternative embodiments, error detection and/or correction may be performed at any suitable level on the storage device 106, such as by the chip controllers 126 or partition controllers.

Figure 4:
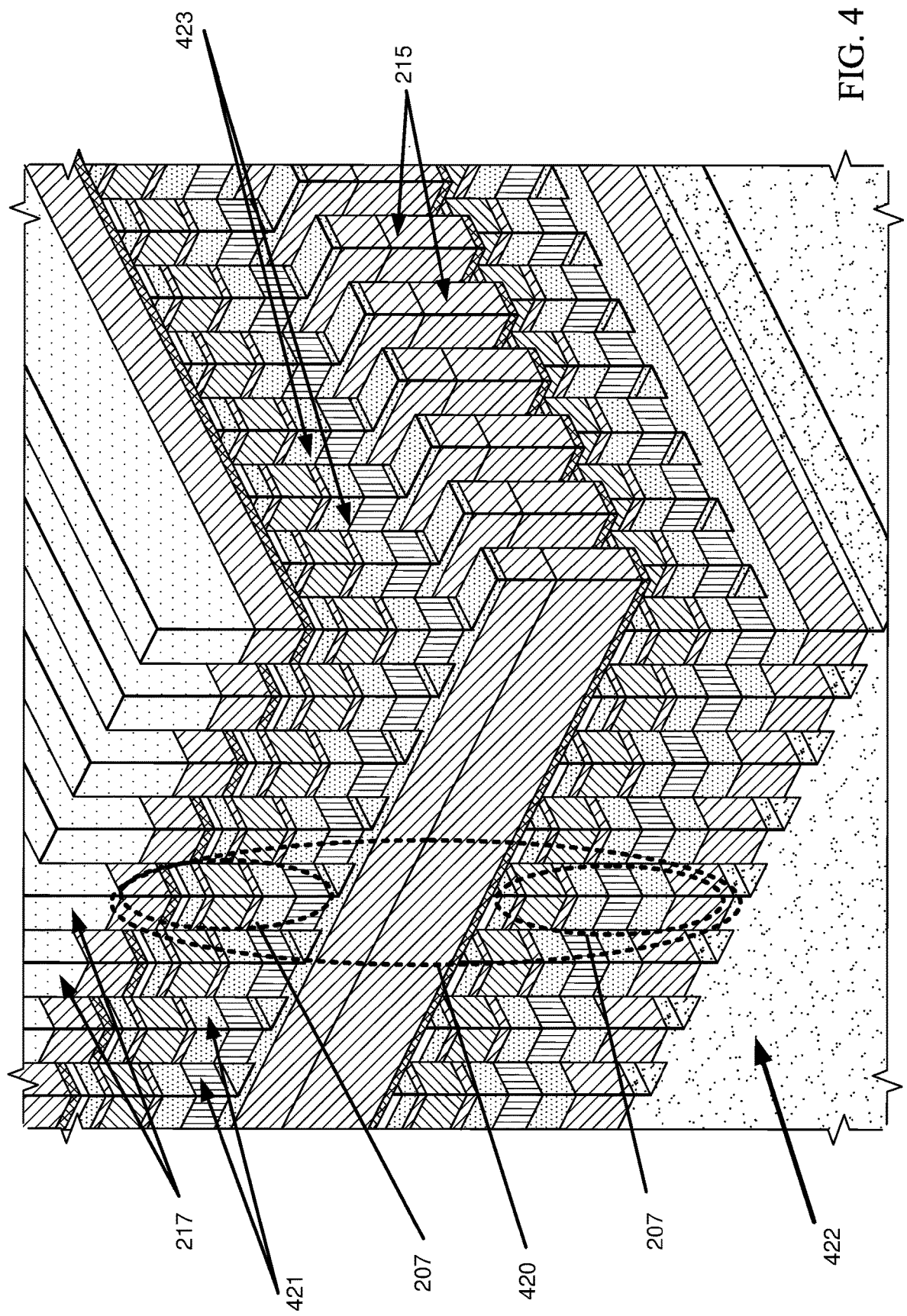
FIG. 4. is a schematic perspective three-dimensional view of a semiconductor structure for a 3D memory architecture according to some embodiments.

FIG. 4 is a perspective diagram of an example of a portion of stack 400 of a 3D crosspoint memory device including memory arrays such as those of FIGS. 2 and 3. The specific layers are merely examples, and will not be described in detail here. Stack 400 is built on substrate structure 422, such as silicon or other semiconductor. Stack 400 includes multiple pillars 420 as memory cell stacks of memory cells 207. In the diagram of stack 400, it will be observed that the WLs and BLs are orthogonal to each other, and traverse or cross each other in a cross-hatch pattern. A crosspoint memory structure includes at least one memory cell in a stack between layers of BL and WL. As illustrated, wordlines (WL) 215 are in between layers of elements, and bitlines (BL) 217 are located at the top of the circuit. Such a configuration is only an example, and the BL and WL structure can be swapped. Thus, in one representation of stack 400, the WLs can be the metal structures labeled as 217, and the BLs can be the metal structures labeled as 215. More generically, WLs and BLs can be referred to as "address lines", referring to signal lines used to address memory cells. Different architectures can use different numbers of stacks of devices, and different configuration of WLs and BLs. It will be understood that the spaces/trenches 421 running in one direction, and spaces/trenches 423 running in a direction perpendicular to trenches 421, the trenches 421 and 423 being defined between pillars 420, are to be typically filled with an insulator. In one example, stack 400 the BL and WL are made of tungsten metal.

At least some of WLs 215 may correspond to WLs 215 of FIG. 2. At least some of the BLs 217 may correspond to BLs 217 of FIG. 2. Substrate structure 422, such as a silicon substrate, may include control circuitry therein (not shown), such as control circuitry including transistors, row decoders, page buffers, etc. Memory cells 207 may correspond to memory cells 207 of FIG. 2. The control circuitry of substrate structure 422 may include, for example, a memory partition controller such as memory partition controller 210, BL control logic such as BL control logic 216, and WL control logic such as WL control logic 214 of FIG. 2. Each row of WLs 215 extending in the Y direction, the corresponding cells as coupled to corresponding BLs, would define a memory array, and may correspond to a memory array such as memory array 206 of FIGS. 2 and 3. Some of the WLs and some of the BLs may include dummy WLs or dummy BLs (not shown in FIG. 4), corresponding to the dummy WLs and dummy BLs in the dummy array 206B of FIGS. 2 and 3.

Semiconductor processing (e.g., fabrication) can be used to form semiconductor devices, such as integrated circuits, memory devices such as the ones described in relation to FIGS. 1-4 above, microelectromechanical devices (MEMS), etc.

Examples of memory devices that can be formed by semiconductor processing include, but are not limited to, volatile memory and non-volatile memory such as NAND flash memory, NOR flash memory, read only memory (ROM), electrically erasable programmable ROM (EEPROM), and erasable programmable ROM (EPROM), among others.

Semiconductor processing can involve forming features or patterns on and/or in a substrate, such as a semiconductor substrate, such as substrate 422 of FIG. 4. In some examples, one or more materials, such as silicon-based materials (e.g., silicon oxide (SiO), silicon nitride (SiN), tetraethyl orthosilicate (TEOS), and/or polysilicon), conductors, etc. may be formed on the semiconductor. Layers made up of the one or more materials are depicted by way of example in FIG. 4, for example between WLs 215 and BLs 217. For instance, a deposition process, such as physical vapor deposition (PVD), chemical vapor deposition (CVD), atomic layer deposition (ALD), electrochemical deposition and/or molecular beam epitaxy, among others may be used to form the materials on the semiconductor. Subsequently, portions of the one or more materials, and in some instances, portions of the semiconductor, may be removed, such as by wet and/or dry etching, to form the features, such as pillars that would eventually make up each of the pillars 420 of FIG. 4. In some examples, the pillars may have high aspect ratios (e.g., ratios of height to width or diameter) and may be referred to as high-aspect-ratio (HAR) pillars. For example, the pillars might be separated from each other by HAR openings.

During processing, the substrate and the pillars may be subjected to wet processing, such as wet cleaning, and subsequent drying. For example, wet cleaning can be helpful to remove residue left behind such as by the removal process or other processing.

In particular, current integration schemes for the fabrication of 3D memory structures, such as 3D memory structures such as the structure in the example shown in FIG. 4, rely on the provision of a nitride liner and an oxide etch protection liner provided using atomic layer deposition (ALD) on top of the nitride liner after a first etch of the various layers of the 3D memory structure. A first etch may first etch through a first subset of the layers of the 3D memory structure to form a first trench, and the nitride liner and etch protection liner may be deposited onto that first trench. The nitride liner and oxide etch protection liner are provided to protect one or more underlying layers within the various layers of the 3D memory structure during a second etch of the various layers. The nitride layer may be provided using chemical vapor deposition (CVD) or atomic layer deposition (ALD), and the oxide may be provided using ALD. For example, a second etch may subsequently etch through a second subset of the layers of the 3D memory structure to form a second trench longer than the first trench. Another nitride liner and another oxide etch protection liner using ALD are then provided to protect any sensitive layers during a last etch through a remaining subset of the layers of the 3D memory structure to form a third trench longer than the second trench. This third trench may correspond to trenches 421 or 423 of FIG. 4 by way of example.

The ALD oxide layer provided during the successive etches is typically hydrophilic, leading to a high surface tension during the second etch and last etch wet clean drying processes, which tends to drive line wiggling and/or pattern collapse of high aspect ratio pillars. Thus, in some previous approaches, capillary forces in the trenches, resulting from drying the pillars after wet cleaning, can cause the pillars to topple (e.g., collapse) into each other.

Figure 5:
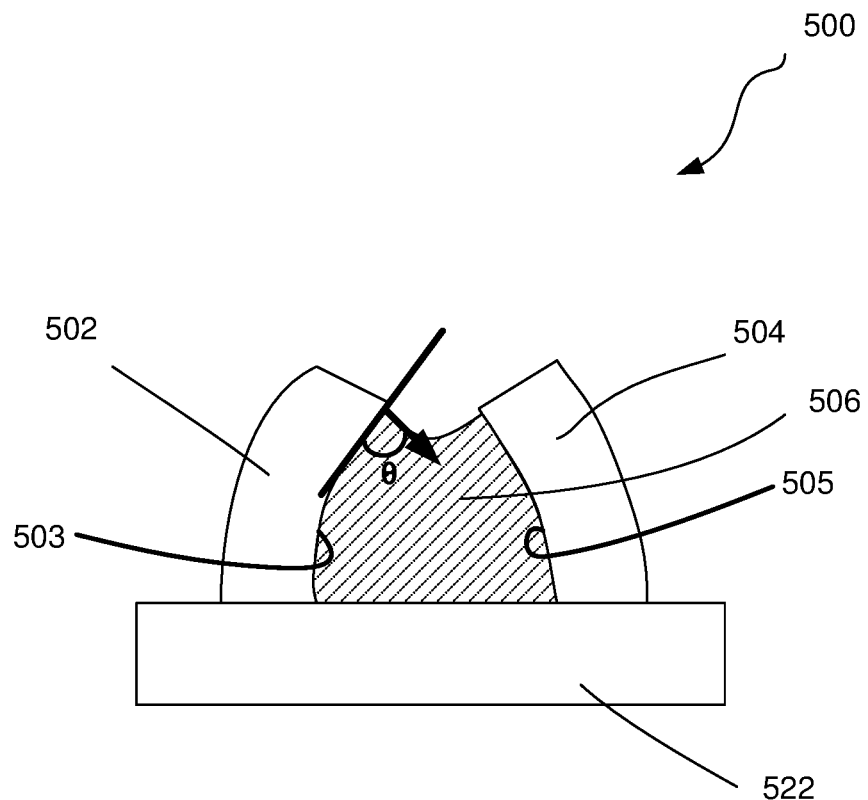
FIG. 5 is a side-elevational cross-sectional view of a semiconductor pattern having undergone pattern collapse or toppling of its high aspect ratio features.

For example, FIG. 5 illustrates a structure 500 including two adjacent HAR pillars 502 and 504 toppling into each other (e.g. in what is sometimes referred to as bridging) because of capillary forces of the liquid 506 therebetween forming a meniscus 505 during drying. The capillary forces may be affected by the speed of drying, the liquid used, and the composition of the side walls surfaces of the shown trenches defined by the pillars. The liquid, for example an aqueous liquid, may have been provided during a wet clean process after etching the pillars 502 into the structure. The capillary forces resulting from drying that drive line bending/toppling are directly related to the water contact angle θ between the surface of the liquid 506 and the surface of side walls 503 and 505 of the HAR pillars 502 and 504, respectively, that contact the liquid. The higher the contact angle, the more hydrophobic the contact surface. The HAR pillars may correspond to multilayered pillars of a 3D memory structure. At the drying stage, the bridging tends to remain, which can lead to defects in the semiconductor device.

Surface modification chemistry (SMC) is can be used to modify oxide and nitride surfaces and hence their surface phobicity and surface tension during drying. However, SMC techniques are too complex and expensive, especially for 3D memory technology. SMC is typically tailored to modify only certain surfaces in a stack containing multiple materials, and its adaptation to a 3D memory manufacturing process is technologically complex and costly, and, even if successful, may not result in materials that are consistent with other materials in the stack, such as in a 3D memory stack.

Various drying methods (such as Maragoni drying, etc.) to minimize pattern collapse have been provided as well. Advanced cleans/drying such as vapor phase HF to pull the residues without using a liquid, or supercritical fluid drying (with a high enough pressure without surface tension) have been provided to eliminate the meniscus effect during drying. However, commonly available drying methods (Maragoni drying, etc.) are limited in their effectiveness and can be costly. For example, the 3D crosspoint technology is too aggressive for these (in terms of feature sizes, number of required etches, etc.) driving the need for more advanced/expensive drying technologies such as supercritical fluid drying.

The present disclosure includes processing methods, such as semiconductor processing methods, associated with forming semiconductor devices, such as integrated circuits, memory devices, MEMS, among others. For example, one such method involves providing a carbon doped etch protection liner on side walls of a plurality of first trenches defined by a plurality of pillars in a multilayered semiconductor structure, performing an etch process to remove material at a bottom surface of the plurality of first trenches while leaving at least some of the etch protection liner on the side walls of the plurality of first trenches, performing the etch process resulting in the first trenches being deepened to form a plurality of second trenches, wet cleaning and drying the multilayered semiconductor structure after performing the etch process and while said at least some of the etch protection liner is on the side walls of the plurality of second trenches, and performing further processing on the multilayered semiconductor structure to integrate the same into a semiconductor device. According to some embodiments, performing further processing may include providing a subsequent carbon doped etch protection liner on side walls of the plurality of second trenches, performing a subsequent etch process to remove material at a bottom surface of the plurality of second trenches while leaving at least some of the etch protection liner on the side walls of the plurality of second trenches, performing the etch process resulting in the second trenches being deepened to form a plurality of third trenches, wet cleaning and drying the multilayered semiconductor structure after performing the subsequent etch process and while said at least some of the subsequent etch protection liner is on the side walls of the plurality of third trenches.

Some embodiments pertain to memory cell trench sidewall liner engineering to modify surface tension induced pattern deformation during wet cleans by providing a carbon containing liner on sidewalls of cell trenches after a dry etch and before wet cleaning and drying. The toppling of semiconductor pillars during a drying phase of a wet clean is typically driven by capillary forces during drying, which is related to the cell aspect ratio, space critical dimension, and contact angle along the cell sidewall Providing a carbon containing liner can mitigate the capillary forces and help to eliminate pillar toppling.

The carbon containing liner may include a carbon-doped material, such as a carbon doped oxide material, for example a carbon doped silicon oxide material, such as SiOC. The carbon containing liner may include a carbon doped nitride material, such as a carbon doped silicon nitride material, such as SiCN. The carbon containing liner may include a carbide material, such as a silicon carbide material.

Some embodiments include replacing a $SiO_2$ liner on sidewalls of trenches in a semiconductor structure (such as one deposited using atomic layer deposition (ALD)), for example one provided between a first and a second etch, or between a second etch or a last etch, with a liner with a higher contact angle surface when contacted by a wet cleaning liquid in order to control pattern deformation of pillars defining the trenches. For example, some embodiments provide a ALD deposited carbon-doped liner, such as SiOC, on the sidewalls of the trenches. Adding carbon to the oxide will reduce the hydrophilicity of the surface and reduce the surface tension (contact angle) that drives pattern deformation and toppling during drying after a wet etch. The provision of SiCN or of SiC liner/seals are some other potential embodiments in addition to or instead of the carbon-doped silicon oxide liner. In embodiments where SiCN or SiC is provided as part of the etch protection liner, an additional oxide layer may not be necessary for etch protection because carbon doping SiN slows its etch rate. Thus the SiCN or SiC alone my act as a hydrophobic etch protection liner without the need for an additional oxide layer.

Adding carbon to the liner will reduce the hydrophilicity of the trench surface and reduce the surface tension (contact angle) during drying that drives pattern deformation. Transmission electron microscopy (TEM) using energy dispersive X-ray spectroscopy is one way to detect use of carbon or carbon doped etch liners in a semiconductor device including HAR pillars. ALD SiOC has been demonstrated at temperatures less than 150 degrees Celsius in Wang, eta al., "ALD of Carbon Doped Silicon Oxide," J. Vac. Sci. Technol. A 36(2), 2018, 021509-1).

Embodiments provide a number of technical advantages, such as reducing the likelihood of pillar toppling (e.g. collapse) during semiconductor processing involving HAR pillars, compared with previous approaches. The pillar toppling, as noted previously, may result from drying occurring after wet cleaning. The provision of a carbon containing etch protection liner, such as a carbon doped etch protection liner or etch stop layer contributes to a hydrophobicity of the etch protection liner as compared with an etch protection liner that does not contain carbon, in this way mitigating pillar toppling effects resulting from a meniscus within a wet cleaning liquid in a trench during drying.

Embodiments advantageously help to extend current wet cleans to future nodes, improve process robustness at the current node, and help contain technology costs by eliminating the need for advanced cleaning/drying options.

Some embodiments further advantageously, by providing carbon doped liners, extend the etch resistance of the liners by virtue of the presence of carbon, and provide better etch protection for underlying layers. In such cases, an etch protection oxide liner may be obviated if a carbon doped nitride liner or silicon carbide is provided as the etch protection liner, in this way simplifying and reducing the cost of the method of formation of a multilayered semiconductor structure. In addition, reducing the number of etch protection liners advantageously allows for wider trenches as would have resulted had the oxide layer been present.

In the instant description, the term semiconductor can refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the following description, previous process steps may have been utilized to form regions/junctions in the base semiconductor structure, and the term semiconductor can include the underlying materials containing such regions/junctions.

Figure 6A:
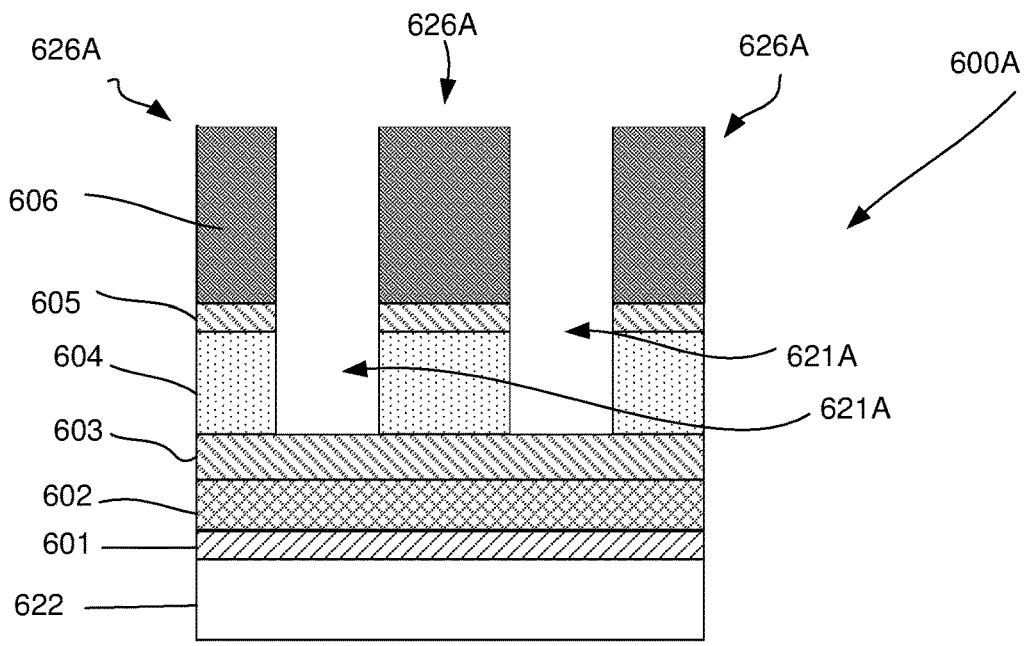
FIG. 6A is a schematic cross-sectional view of a multi-layered semiconductor structure after a first etch process to provide first trenches according to an embodiment.
Figure 6B:
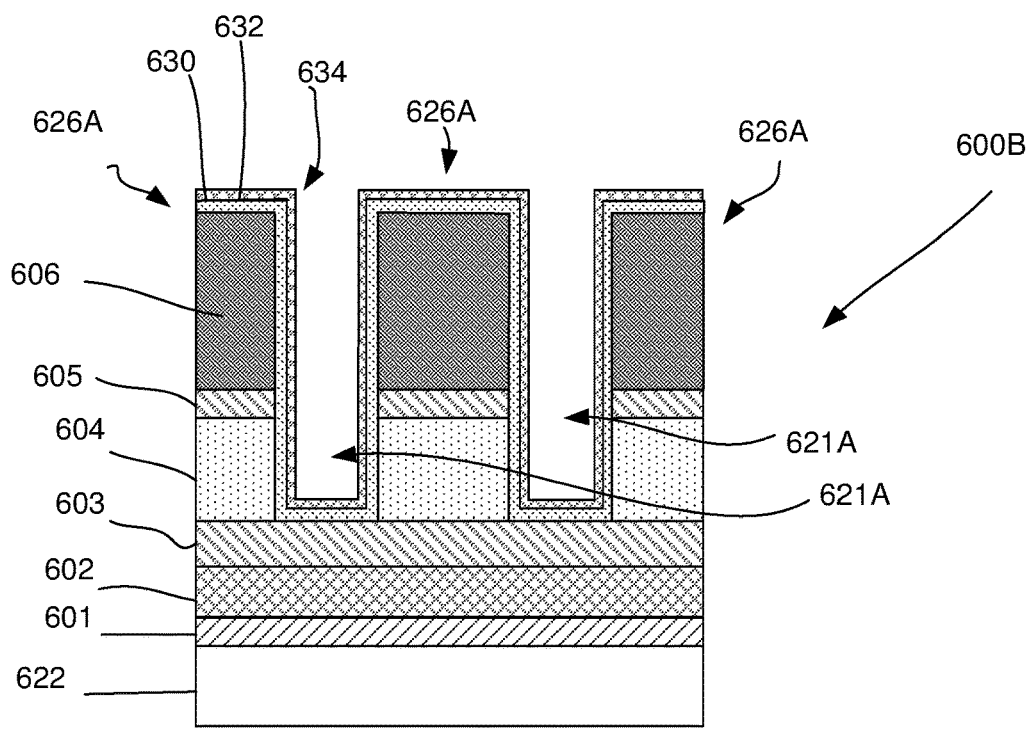
FIG. 6B is a view similar to FIG. 6A, showing the structure of FIG. 6A having been provided with a first etch protection liner according to an embodiment.
Figure 6C:
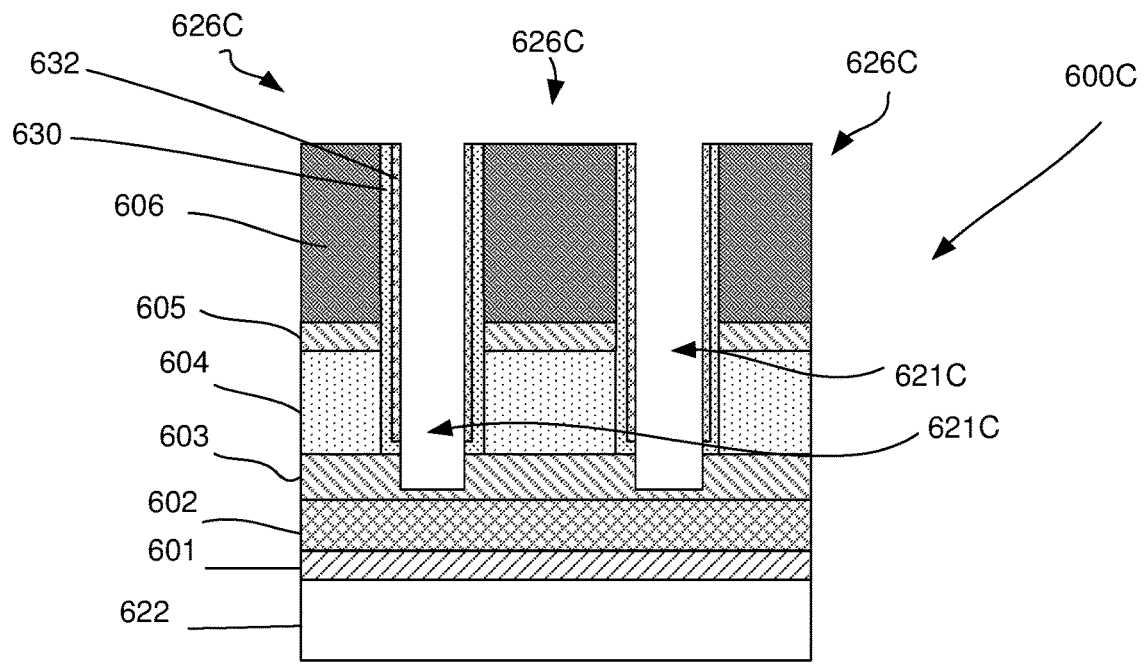
FIG. 6C is a view similar to FIG. 6B, showing the structure of FIG. 6B as having been subjected to a second etch to deepen the first trenches into second longer trenches according to an embodiment.

FIGS. 6A-6C illustrate cross-sectional views of processing stages, such as of a semiconductor processing method, associated with forming a semiconductor device, such as a portion of an integrated circuit, a memory device (such as a 3D crosspoint memory device similar to the one discussed with respect to FIGS. 1-4 above), a MEMS, among others, in accordance with a number of embodiments of the present disclosure. For example, the processing steps may be associated with forming (e.g., a memory cell array of) a DRAM memory device, a NAND flash memory device, or a NOR flash memory device, capacitors, among others.

FIG. 6A depicts a portion of a first multilayered semiconductor structure 600A (e.g., to be used in a semiconductor device) after several processing steps have occurred. The structure may include a base structure, such as a substrate 622 (e.g., a semiconductor, such as a silicon based or a tungsten based semiconductor substrate). In some examples, to form structure 600A, one or more materials may be used to form a first layer 601, a second layer 602, a third layer 603, a fourth layer 604 and a fifth layer 605 of the first multilayered semiconductor structure 600A. Such materials may include, by way of example, silicon-based materials, conductive materials (e.g., metals), among others, may be formed on (e.g., over) a surface 622, such as an upper surface, of substrate 622, using, for example, a deposition process, such as PVD, CVD, ALD, electrochemical deposition and/or molecular beam epitaxy, among others.

As shown in FIG. 6A, first trenches 621A may be formed by way of a first etch through a mask 606, such as a silicon nitride (SiN) hard mask, creating pillars 626A, such as nanofeatures (e.g., having a width or diameter of about 0.1 nanometer to about 100 nanometers). Pillars 626A may be formed by removing portions of the layers, such as portions of the materials of the fifth layer 605, fourth layer 604 and third layer 603. The removal process forms the first trenches 621A, such as spaces or openings, through the one or more material layers, stopping above, on, or in (e.g., as shown in FIG. 6A) one of the layers, such as the third layer 603 in the shown example. The first trenches 621 A may be between adjacent pillars 626A.

In some examples, first trenches 621A, and thus the structure 600A in FIG. 6A, may be formed using a dry removal process, such as a dry etch. Mask 606, such as imaging resist (e.g., photo-resist), such as a silicon nitride mask, may be formed over the layers in the multilayered semiconductor structure 600A, and patterned to expose regions of the same. The exposed regions may be subsequently removed, such as by the dry etch process, to form first trenches 621A.

FIG. 6B show the structure of FIG. 6A after deposition of a first nitride liner 630 and a first oxide liner 632 in the first trenches 621A of first multilayered semiconductor structure 600A to form structure 600B. Although FIG. 6B shows the first nitride liner 630 and first oxide liner 632 as having been deposited not only on the trench walls, but also on the mask 606, embodiments are not so limited. Some embodiments provide a carbon-containing liner on at least portions of side walls of trenches in a semiconductor structure prior to an etch to deepen the trenches, and to a wet clean and drying of the same.

Referring still to FIG. 6B, the nitride liner 630 and oxide liner 632 together provide an etch protection liner or carbon-containing liner 634 for one or more of the material layers 604-605 during a subsequent second etch to be addressed in the context of FIG. 6C. The liner 634 is carbon-containing to the extent that it includes at least one liner that contains carbon, in this case, the carbon-doped oxide 632. Embodiments are not limited to the use of a nitride layer and oxide layer as described herein, but include within their scope of provision of an etch protection liner (which itself may include one or more layers) within trenches of a semiconductor structure to provide etch protection for one or more material layers of the underlying semiconductor structure.

According to some embodiments, the etch protection liner may be substantially conformal with respect to the surfaces of each trench. According to embodiments, a surface of the etch protection liner may be carbon doped. For example, where the etch protection liner includes the oxide liner 632, the oxide liner 632 may be a carbon doped oxide layer. A carbon doping of the etch protection liner 634 has the effect that surfaces thereof facing a corresponding second trench 621C lead to a larger contact angle with a wet cleaning liquid to fill the corresponding trench during wet cleaning as compared with an alternative of the etch protection liner 634 (such as oxide liner 632) not being carbon doped and as a result being more hydrophilic. The larger contact angle can help to substantially mitigate a HAR toppling effect brought about by liquid capillary forces acting on trench walls, as described by way of example in the context of FIG. 4, in this way obviating the issue of defective semiconductor products caused by the topping effect during a wet clean and dry process.

According to some embodiments, carbon doping of the oxide layer may for example be implemented using ALD of the oxide with a carbon precursor. The oxide layer may be carbon doped to include, by way of example, and in terms of atomic percentages, from about 10% to about 30% atomic percent carbon, from about 10% to about 50% atomic percent carbon, or from about 15% to about 20% atomic percent carbon.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually. Embodiments are not limited to providing the etch protection liner 634 on the top facing regions of the mask, or even on the top facing surfaces of the layer to be etched in an etch subsequent to the first etch (in this case the top facing surfaces of the third layer 603). Embodiments thus encompass at a minimum providing a carbon doped etch protection liner on side walls of a plurality of first trenches to protect at least one layer of the multilayered semiconductor structure with side walls facing the first trenches.

FIG. 6C shows the structure of FIG. 6B after a second etch and wet clean, which results in a second multilayered semiconductor structure 600C defining second trenches 621C and second HAR pillars 626C. The multilayered semiconductor structure 600C may be formed, similar to structure 600A, using a dry removal process, such as a dry second etch. The second etch in the example of FIG. 6C removes parts or all of the third layer 603, including any of the etch protection liner 634 that may have existed at a bottom surface of the first plurality of trenches 621A. The first trenches 621A of FIG. 6A expose regions of the multilayered semiconductor structure 600A to the second etch. The exposed regions may thus be subsequently removed, such as by the dry second etch process, to extend the first trenches (to deepen them) to form the second trenches 621C therefrom. The etch protection liner 634, including the carbon doped oxide liner 632, serves to protect layer 604 during the second etch to deepen the first trenches 621A into the second trenches 621C.

In FIG. 6C, after the dry processing in the form of the second etch and provision of the first etch protection liner 634, a wet cleaning process may be performed on the structure of FIG. 6B to remove residues on exposed surfaces of pillars 626C, such as in second trenches 621C. In some examples, the wet cleaning process may include an aqueous wet clean that may include hydrofluoric acid (HF). In an example, an aqueous wet clean may include a standard clean-1 (SC-1) that may include deionized (DI) water, aqueous ammonium hydroxide, and aqueous hydrogen peroxide. For example, the standard clean-1 may be performed before and after applying the HF. In some instances, a standard clean-2 (SC-2) that may include deionized (DI) water, aqueous hydrochloric acid, and aqueous hydrogen peroxide may be performed after the standard clean-1 as part of the aqueous wet clean. The wet cleaning process may further include the aqueous wet clean followed by a liquid DI water rinse.

Figure 6D:
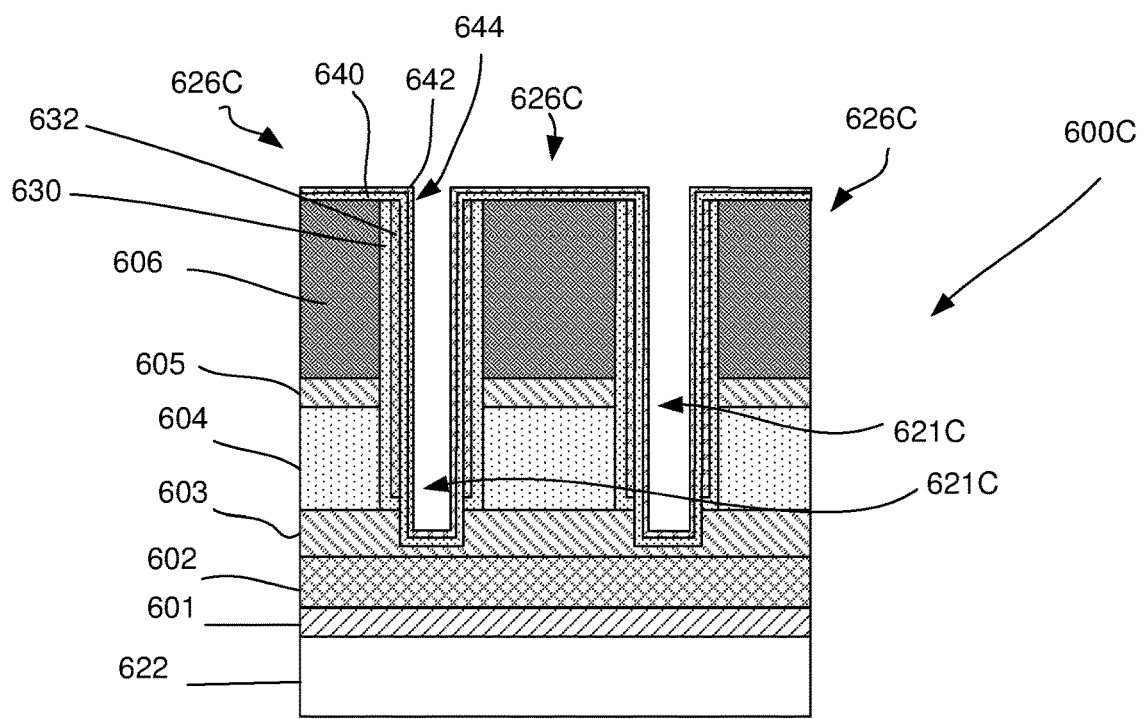
FIG. 6D is a view similar to FIG. 6C, showing the structure of FIG. 6C having been provided with a second etch protection liner according to an embodiment.

FIG. 6D show the structure of FIG. 6C after deposition of a second nitride liner 640 and a first oxide liner 642 in the second trenches 621C of second multilayered semiconductor structure 600C. Although FIG. 6D shows the second nitride liner 640 and second oxide liner 642 as having been deposited not only on the trench walls, but also on the mask 606, embodiments are not so limited. Some embodiments provide a carbon-doped etch protection liner on at least side walls of trenches in a semiconductor structure prior to an etch to deepen the trenches, and a wet clean and drying of the same. The etch protection liner 644 in FIG. 6D may be deposited in the same way as the etch protection liner 634 of FIG. 6B.

Figure 6E:
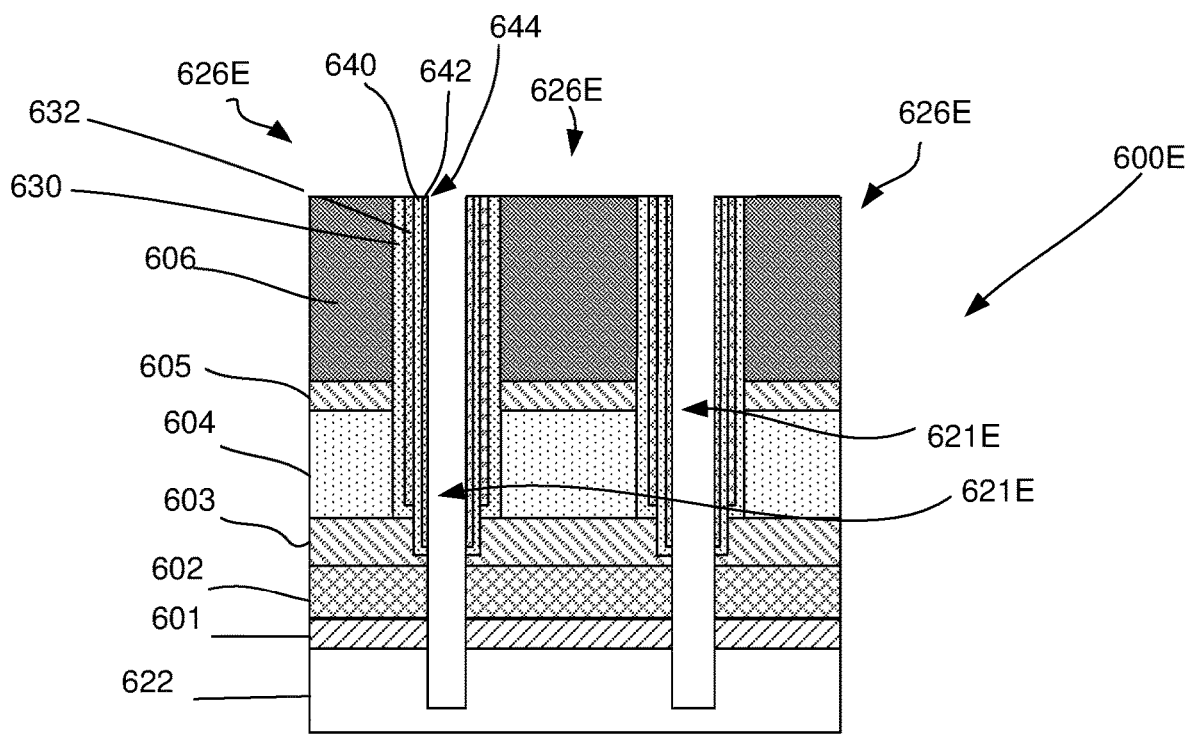
FIG. 6E is a view similar to FIG. 6D, showing the structure of FIG. 6D having been subjected to a last etch to deepen the second trenches into third longer trenches according to an embodiment, the structure of FIG. 6E to be used in a semiconductor architecture of a microelectronic device according to one embodiment.

Referring therefore still to FIG. 6D, the nitride liner 640 and oxide liner 642 together provide the etch protection liner or carbon-containing liner 644 for one or more of the material layers 603-605 during a subsequent "last" etch to be addressed in the context of FIG. 6E. The liner 644 is carbon-containing to the extent that it includes at least one liner that contains carbon, in this case, the carbon-doped oxide 642. Embodiments are not limited to the use of a nitride layer and oxide layer as described herein, but include within their scope of provision of an etch protection liner (which itself may include one or more layers) within trenches of a semiconductor structure to provide etch protection for one or more material layers of the underlying semiconductor structure.

Similar to the etch protection liner 634 described in the context of the second etch, according to some embodiments, the etch protection liner 644 may be substantially conformal with respect to the surfaces of each trench. According to embodiments, a surface of the etch protection liner may be carbon doped. For example, where the etch protection liner includes the oxide liner 642, the oxide liner 642 may be a carbon doped oxide layer. A carbon doping of the etch protection liner 644 has the effect that surfaces thereof facing a corresponding second trench 621C lead to a larger contact angle with a wet cleaning liquid to fill the corresponding trench during wet cleaning as compared with an alternative of the etch protection liner 644 (such as oxide liner 642) not being carbon doped and as a result being more hydrophilic. The larger contact angle can help to substantially mitigate a HAR toppling effect brought about by liquid capillary forces acting on trench walls, as described by way of example in the context of FIG. 4, in this way obviating the issue of defective semiconductor products caused by the topping effect during a wet clean and dry process.

According to some embodiments, similar to oxide liner 632 described in the context of FIG. 6B, carbon doping of the oxide liner 642 may for example be implemented using ALD of the oxide with a carbon precursor. The oxide layer may be carbon doped to include, by way of example, from about 10% to about 30% atomic percent carbon, from about 10% to about 50% atomic percent carbon, or from about 15% to about 20% atomic percent carbon.

In both cases of FIGS. 6C and 6D, the oxide liner 632/642 is where the wet clean liquid meniscus during drying as shown in FIG. 4 will pull the pillars together due to capillary forces. These forces can be reduced by carbon doping the oxide as noted previously.

FIG. 6E shows the structure of FIG. 6D after a last etch and wet clean, which results in a third multilayered semiconductor structure 600E defining third trenches 621E and third HAR pillars 626E. The multilayered semiconductor structure 600E may be formed, similar to structure 600C, using a dry removal process, such as a dry last etch. The last etch in the example of FIG. 6E removes any remaining parts of the third layer 603, including any of the etch protection liner 644 that may have existed at a bottom surface of the second plurality of trenches 621C. The second trenches 621C of FIG. 6C expose regions of the multilayered semiconductor structure 600C to the last etch. The exposed regions may thus be subsequently removed, such as by the dry last etch process, to extend the second trenches (to deepen them) to form the third trenches 621E therefrom. The etch protection liner 644, including the carbo doped oxide liner 642, serves to protect layer 604 during the last etch to deepen the second trenches 621C into the third trenches 621E.

In FIG. 6E, after the dry processing in the form of the last etch and the provision of second etch protection liner 644, a wet cleaning process may be performed on the structure of FIG. 6D to remove residues that can form on exposed surfaces of pillars 626E, such as in third trenches 621E. In some examples, the wet cleaning process may include an aqueous wet clean that may include hydrofluoric acid (HF). In an example, an aqueous wet clean may include a standard clean-1 (SC-1) that may include deionized (DI) water, aqueous ammonium hydroxide, and aqueous hydrogen peroxide. For example, the standard clean-1 may be performed before and after applying the HF. In some instances, a standard clean-2 (SC-2) that may include deionized (DI) water, aqueous hydrochloric acid, and aqueous hydrogen peroxide may be performed after the standard clean-1 as part of the aqueous wet clean. The wet cleaning process may further include the aqueous wet clean followed by a liquid DI water rinse.

FIGS. 6A-6E merely provide an example of methods and resulting structures according to some embodiments. Embodiments are not limited to semiconductor processes involving necessarily a multilayered structure below a mask, a five layered structure below a mask, or to a 3D memory structure with the succession of material layers as shown. For example, the noted layers may have other layers between them, below them or above them. In addition, although the various etch processes at the second etch and last etch suggest that the entirely of the top facing part of the liners are etched off during each etch, in reality, it is possible that not all of the top facing part of the liners are etched, and that some may remain. Some of the liners on the sidewalls with surfaces making up the trench sidewalls may further be etched off partially during each etch. The hard mask may also be made thinner by each successive etch, although these possibilities are not shown in FIGS. 6A-6E.

Thickness ranges for the nitride and oxide layers according to some example embodiments may include about 1 nm to about 5 nm for the nitride layer, and about 0.5 to about 3 nm for the oxide layer. The nitride layer may be provided using plasma enhanced chemical vapor deposition (PECVD) or ALD. The oxide liner may include, apart from silicon oxides, metal oxides, such as HfOx, AlOx or TiOx by way of example. For the FP etch, an oxide liner provides etch protection, and the nitride liner provides an adhesion layer below the oxide liner. For the last etch, the oxide may be used as a gap fill material to allowing wetting and sticking during production.

According to some embodiments, where the carbon-containing liner includes SiCN or SiC, these may be formed by implanting SiN or amorphous Si with carbon.

According to some embodiments, providing a carbon-doped liner may include doping an initial material of the liner, such as an oxide, with carbon using carbon implanting after deposition of the initial material of the liner (such as an oxide). According to another embodiment, ALD of the carbon-doped liner material may be performed where the initial liner material is ALD deposited using a precursor with carbon (in which case the carbon-containing liner material is deposited as the carbon doped material and not carbon doped after deposition).

According to one embodiment, where ALD is used to provide the carbon-containing liner, the ALD deposition temperature may be between about 100 degrees Celsius to about 300 degrees Celsius according to one example.

According to one embodiment, the carbon-containing liner may include a material that includes carbon substantially uniformly distributed throughout, or it may include a material showing a graded carbon containing material with more carbon on a surface thereof facing trenches.

Figure 7:
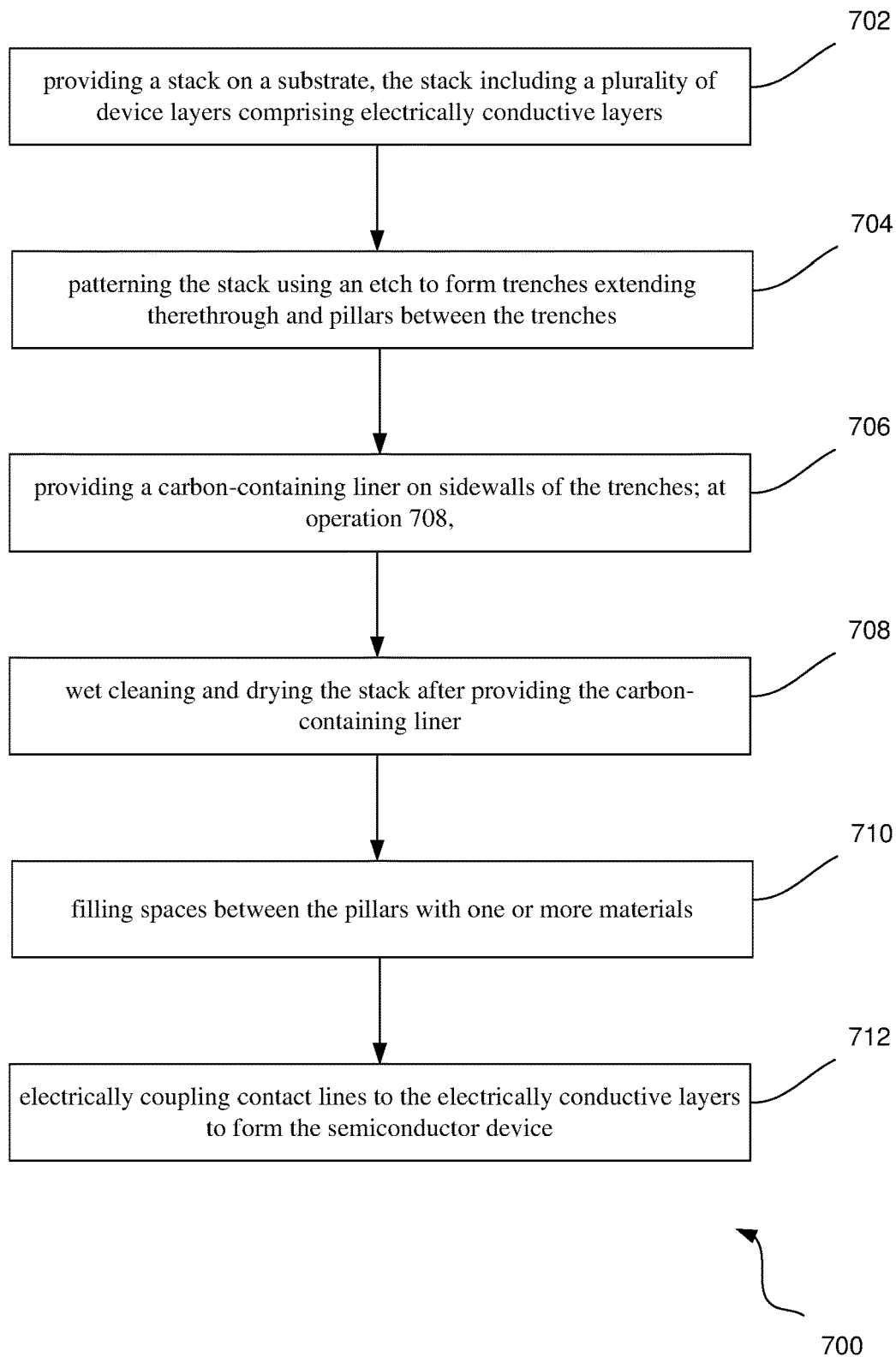
FIG. 7 illustrates an example process to pattern a semiconductor structure in accordance with certain embodiments.

FIG. 7 illustrates an example of a process 700 according to some embodiments. The process includes, at operation 702, providing a stack on a substrate, the stack including a plurality of device layers comprising electrically conductive layers; at operation 704, patterning the stack using an etch to form trenches extending therethrough and pillars between the trenches; at operation 706, providing a carbon-containing liner on sidewalls of the trenches; at operation 708, wet cleaning and drying the stack after providing the carbon-containing liner; at operation 710, filling spaces between the pillars with one or more materials; and at operation 712, electrically coupling contact lines to the electrically conductive layers to form the semiconductor device.

The flow described in FIG. 7 is merely representative of operations that may occur in particular embodiments. Various embodiments of the present disclosure contemplate any suitable signaling mechanisms for accomplishing the functions described herein. Some of the operations illustrated in FIG. 7 may be repeated, combined, modified, or deleted where appropriate. Additionally, operations may be performed in any suitable order without departing from the scope of particular embodiments.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable storage medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, cores 114A and 114B, I/O controller 110, CPU memory controller 112, storage device 106, system memory device 107, memory chip 116, storage device controller 118, address translation engine 120, memory partition 122, program control logic 124, chip controller 126, memory array 306, memory partition controller 310, word line control logic 314, bit line control logic 316, or other entity or component described herein, or subcomponents of any of these. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware, or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a The machine-readable storage medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage medium used in the transmission of information over the Internet via electrical, optical, acoustical or other forms of propagated signals (e.g., carrier waves, infrared signals, digital signals, etc.). Accordingly, the computer-readable medium includes any type of tangible machine-readable storage medium suitable for storing or transmitting electronic instructions or information in a form readable by a machine (e.g., a computer).

Some examples of embodiments are provided below.
Example 1 includes a semiconductor device comprising:
a multilayered semiconductor structure including a substrate, a plurality of device layers on the substrate defining trenches extending therethrough and pillars between the trenches, one or more materials filling the trenches, and a carbon-containing liner on at least portions of sidewalls of the trenches and disposed between the pillars and the one or more materials filling the trenches, one or more of the plurality of device layers including electrically conductive layers; and electrical contact lines electrically coupled to the one or more of the plurality of device layers.

Example 2 includes the subject matter of Example 1, and optionally, wherein the carbon-containing liner includes at least one of a carbon-doped oxide liner or a carbon-doped nitride liner.

Example 3 includes the subject matter of Example 1, and optionally, wherein the carbon-containing liner includes a carbon-doped nitride liner, and wherein the at least portions of sidewalls of the trenches having the carbon-doped nitride liner thereon do not include an oxide liner thereon.

Example 4 includes the subject matter of Example 1, and optionally, wherein the carbon-containing liner includes at least one of SiOC, SiCN or SiC.

Example 5 includes the subject matter of Example 1, and optionally, wherein the carbon-containing liner includes a nitride liner on the at least portions of sidewalls of the trenches, and a carbon-doped oxide liner on the nitride liner such that the nitride liner is between the pillars and the carbon-doped oxide liner.

Example 6 includes the subject matter of Example 5, and optionally, wherein the nitride liner is a first nitride liner, and the carbon-doped oxide liner is a first carbon-doped oxide liner, the carbon-containing liner further including one or more additional nitride and carbon-doped oxide liner pairs disposed on the first carbon-doped oxide liner such that a last carbon-doped oxide liner of the additional liner pairs has surfaces facing an interior of the trenches.

Example 7 includes the subject matter of Example 1, and optionally, wherein: the device is a non-volatile memory device; the pillars include memory cells of the non-volatile memory device, the memory cells defined in part by the plurality of device layers.

Example 8 includes the subject matter of Example 1, and optionally, wherein the carbon-containing liner includes a liner made of a material containing, in terms of atomic percentages, from about 10% to about 50% carbon, from about 10% to about 30% carbon, or from about 15% to about 20% carbon.

Example 9 includes the subject matter of Example 1, and optionally, wherein the carbon-containing liner includes a liner made of a material that is one of substantially uniformly doped throughout its thickness, or non-uniformly doped throughout its thickness.

Example 10 includes a method of forming a device including: providing a stack on a substrate, the stack including a plurality of device layers comprising electrically conductive layers; patterning the stack using an etch to form trenches extending therethrough and pillars between the trenches; providing a carbon-containing liner on sidewalls of the trenches; wet cleaning and drying the stack after providing the carbon-containing liner; filling spaces between the pillars with one or more materials; and electrically coupling contact lines to the electrically conductive layers to form the device.

Example 11 includes the subject matter of Example 10, and optionally, wherein providing the carbon-containing liner includes providing a carbon-doped liner at a temperature between about 100 degrees Celsius to about 300 degrees Celsius.

Example 12 includes the subject matter of Example 10, and optionally, wherein providing the carbon-containing liner includes using atomic layer deposition of a material of the liner together with a carbon precursor to provide a carbon-doped liner.

Example 13 includes the subject matter of Example 10, and optionally, wherein the carbon-containing liner includes a nitride liner on the sidewalls of the trenches, and a carbon-doped oxide liner on the nitride liner such that the nitride liner is between the pillars and the carbon-doped oxide liner.

Example 14 includes the subject matter of Example 13, and optionally, wherein the trenches are first trenches, the pillars are first pillars, the etch is a first etch, the nitride liner is a first nitride liner, and the carbon-doped oxide liner is a first carbon-doped oxide liner, the method further including: patterning the stack, after wet cleaning and drying the stack, using a second etch to deepen the first trenches and lengthen the first pillars to form second trenches extending through the stack and second pillars between the second trenches; providing a second carbon-containing liner on sidewalls of the second trenches; wet cleaning and drying the stack after providing the second carbon-containing liner; and filling spaces between the second pillars with the one or more materials.

Example 15 includes the subject matter of Example 10, and optionally, wherein: the device a non-volatile memory device; and the pillars include memory cells of the non-volatile memory device, the memory cells defined in part by the plurality of device layers.

Example 16 includes the subject matter of Example 10, and optionally, wherein the carbon-containing liner includes a liner made of a material containing, in terms of atomic percentages, from about 10% to about 50% carbon, from about 10% to about 30% carbon, or from about 15% to about 20% carbon.

Example 17 includes device comprising: input/output (I/O) circuitry to couple the device with an external controller; one or more dies, each of the dies including: a multilayered semiconductor structure including a substrate, a plurality of device layers on the substrate defining trenches extending therethrough and pillars between the trenches, one or more materials filling the trenches, and a carbon-containing liner on at least portions of sidewalls of the trenches and disposed between the pillars and the one or more materials filling the trenches, one or more of the plurality of device layers including electrically conductive layers; and electrical contact lines electrically coupled to the one or more of the plurality of device layers.

Example 18 includes the subject matter of Example 17, and optionally, wherein: the device is a memory module; each of the dies is a non-volatile memory device; the pillars include memory cells of the non-volatile memory device, the memory cells defined in part by the plurality of device layers.

Example 19 includes the subject matter of Example 17, and optionally, wherein the carbon-containing liner includes at least one of a carbon-doped oxide liner or a carbon-doped nitride liner.

Example 20 includes the subject matter of Example 17, and optionally, wherein the carbon-containing liner includes a carbon-doped nitride liner, and wherein the at least portions of sidewalls of the trenches having the carbon-doped nitride liner thereon do not include an oxide liner thereon.

Example 21 includes the subject matter of Example 17, and optionally, wherein the carbon-containing liner includes at least one of SiOC, SiCN or SiC.

Example 22 includes the subject matter of Example 17, and optionally, wherein the carbon-containing liner includes a nitride liner on the at least portions of sidewalls of the trenches, and a carbon-doped oxide liner on the nitride liner such that the nitride liner is between the pillars and the carbon-doped oxide liner.

Example 23 includes the subject matter of Example 22, and optionally, wherein the nitride liner is a first nitride liner, and the carbon-doped oxide liner is a first carbon-doped oxide liner, the carbon-containing liner further including one or more additional nitride and carbon-doped oxide liner pairs disposed on the first carbon-doped oxide liner such that a last carbon-doped oxide liner of the additional liner pairs has surfaces facing an interior of the trenches.

Example 24 includes the subject matter of Example 17, and optionally, wherein the carbon-containing liner includes a liner made of a material containing, in terms of atomic percentages, from about 10% to about 50% carbon, from about 10% to about 30% carbon, or from about 15% to about 20% carbon.

Example 25 includes the subject matter of Example 17, and optionally, wherein the carbon-containing liner includes a liner made of a material that is one of substantially uniformly doped throughout its thickness, or non-uniformly doped throughout its thickness.

Example 26 includes a device comprising: one or more processors and one or more computer-readable media comprising instructions that, when executed by the one or more processors, cause the one or more processors to perform the method, techniques, or process as described in or related to any of the Examples above, or portions thereof.

Example 27 includes a signal as described in or related to any of the Examples above, or portions or parts thereof.

Example 28 includes a datagram, packet, frame, segment, protocol data unit (PDU), or message as described in or related to any of the Examples above, or portions or parts thereof, or otherwise described in the present disclosure.

Example 29 includes a signal encoded with data as described in or related to any of the Examples above, or portions or parts thereof, or otherwise described in the present disclosure.

Example 30 includes a signal encoded with a datagram, packet, frame, segment, protocol data unit (PDU), or message as described in or related to any of the Examples above, or portions or parts thereof, or otherwise described in the present disclosure.

Example 31 includes an electromagnetic signal carrying computer-readable instructions, wherein execution of the computer-readable instructions by one or more processors is to cause the one or more processors to perform the method, techniques, or process as described in or related to any of the Examples above, or portions thereof.

Example 32 includes a computer program comprising instructions, wherein execution of the program by a processing element is to cause the processing element to carry out the method, techniques, or process as described in or related to any of the Examples above, or portions thereof.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. A semiconductor device comprising:
a multilayered semiconductor structure including a substrate, a plurality of device layers on the substrate defining trenches extending therethrough and pillars between the trenches, one or more materials filling the trenches, and a carbon-containing liner along sidewalls of the trenches and disposed between the pillars and the one or more materials filling the trenches, one or more of the plurality of device layers including electrically conductive layers, wherein the sidewalls define a stepped configuration in a depthwise direction of the trenches, and wherein the carbon-containing liner includes a first carbon containing liner portion extending along the sidewalls and ending at a first step of the stepped configuration, and a second carbon containing liner portion extending along the sidewalls and ending at a second step of the stepped configuration; and
electrical contact lines electrically coupled to the one or more of the plurality of device layers.

2. The semiconductor device of claim 1, wherein the carbon-containing liner includes at least one of a carbon-doped oxide liner or a carbon-doped nitride liner.

3. The semiconductor device of claim 1, wherein the carbon-containing liner includes a carbon-doped nitride liner, and wherein the sidewalls of the trenches having the carbon-doped nitride liner thereon do not include an oxide liner thereon.

4. The semiconductor device of claim 1, wherein the carbon-containing liner includes at least one of SiOC, SiCN or SiC.

5. The semiconductor device of claim 1, wherein the carbon-containing liner includes a nitride liner and a carbon-doped oxide liner on the nitride liner such that the nitride liner is between the pillars and the carbon-doped oxide liner.

6. The semiconductor device of claim 1, wherein:
the semiconductor device is a non-volatile memory device; and
the pillars include memory cells of the non-volatile memory device, the memory cells defined in part by the plurality of device layers.

7. The semiconductor device of claim 1, wherein the carbon-containing liner includes a liner made of a material containing, in terms of atomic percentages, from about 10% to about 50% carbon.

8. The semiconductor device of claim 1, wherein the carbon-containing liner includes a liner made of a material that is one of substantially uniformly doped throughout its thickness, or non-uniformly doped throughout its thickness.

9. A method of forming a semiconductor device including:

providing a stack on a substrate, the stack including a plurality of device layers comprising electrically conductive layers;

patterning the stack using a first etch to form first trenches extending therethrough and first pillars between the trenches;

providing a first carbon-containing liner on sidewalls of the first trenches;

wet cleaning and drying the stack after providing the first carbon-containing liner;

patterning the stack, after wet cleaning and drying the stack, using a second etch to deepen the first trenches and lengthen the first pillars to form second trenches extending through the stack and second pillars between the second trenches;

providing a second carbon-containing liner on sidewalls of the second trenches;

wet cleaning and drying the stack after providing the second carbon-containing liner;

filling spaces between the first pillars and the second pillars with one or more materials; and electrically coupling contact lines to the electrically conductive layers to form the semiconductor device.

10. The method of claim 9, wherein providing individual ones of the first carbon-containing liner and the second carbon-containing liner includes providing a carbon-doped liner at a temperature between about 100 degrees Celsius and about 300 degrees Celsius.

11. The method of claim 9, wherein providing individual ones of the first carbon-containing liner and the second carbon-containing liner includes using atomic layer deposition of a material of said individual ones of the first carbon-containing liner and the second carbon-containing liner together with a carbon precursor.

12. The method of claim 9, wherein individual ones of the first carbon-containing liner and the second carbon-containing liner include a nitride liner and a carbon-doped oxide liner on the nitride liner such that the nitride liner is between, on one hand, a corresponding one of the first pillars or the second pillars, and on another hand, the carbon-doped oxide liner.

13. The method of claim 9, wherein:
the semiconductor device a non-volatile memory device; and
the first pillars and the second pillars together include memory cells of the non-volatile memory device, the memory cells defined in part by the plurality of device layers.

14. The method of claim 9, wherein the carbon-containing liner includes a liner made of a material containing, in terms of atomic percentages, from about 10% to about 50% carbon.

15. A semiconductor module comprising:
input/output (I/O) circuitry to couple the semiconductor module with an external controller;
one or more dies, each of the dies including:
a multilayered semiconductor structure including a substrate, a plurality of device layers on the substrate defining trenches extending therethrough and pillars between the trenches, one or more materials filling the trenches, and a carbon-containing liner along sidewalls of the trenches and disposed between the pillars and the one or more materials filling the trenches, one or more of the plurality of device layers including electrically conductive layers, wherein the sidewalls define a stepped configuration in a depth-wise direction of the trenches, and wherein the carbon-containing liner includes a first carbon containing liner portion extending along the sidewalls and ending at a first step of the stepped configuration, and a second carbon containing liner portion extending along the sidewalls and ending at a second step of the stepped configuration; and
electrical contact lines electrically coupled to the one or more of the plurality of device layers.

16. The semiconductor module of claim 15, wherein:
the semiconductor module is a memory module;
each of the dies is a non-volatile memory device; and
the pillars include memory cells of the non-volatile memory device, the memory cells defined in part by the plurality of device layers.

17. The semiconductor module of claim 15, wherein the carbon-containing liner includes at least one of a carbon-doped oxide liner or a carbon-doped nitride liner.

18. The semiconductor module of claim 15, wherein the carbon-containing liner includes at least one of SiOC, SiCN or SiC.

* * * * *